United States Patent
Yoo et al.

(10) Patent No.: US 6,372,616 B1
(45) Date of Patent: Apr. 16, 2002

(54) METHOD OF MANUFACTURING AN ELECTRICAL INTERCONNECTION OF A SEMICONDUCTOR DEVICE USING AN EROSION PROTECTING PLUG IN A CONTACT HOLE OF INTERLAYER DIELECTRIC LAYER

(75) Inventors: Bong-young Yoo, Seongnam; Hyeon-deok Lee, Seoul; Il-gu Kim, Seongnam, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/670,818

(22) Filed: Sep. 28, 2000

(30) Foreign Application Priority Data

Sep. 29, 1999 (KR) .............................. 99-41777

(51) Int. Cl.⁷ ........................................ H01L 21/3205
(52) U.S. Cl. ...................... 438/592; 438/610; 438/640; 438/692; 438/738; 438/580
(58) Field of Search ................. 438/592, 640, 438/738, 692, 610, 580

(56) References Cited

U.S. PATENT DOCUMENTS 6,006,764 A * 12/1999 Chu et al. .................... 134/1.2
6,022,810 A * 2/2000 Kusumi et al. ............. 438/738
6,121,149 A * 9/2000 Lukane et al. .............. 438/692
6,211,071 B1 * 4/2001 Lukane et al. .............. 438/640

* cited by examiner

Primary Examiner—Michael S. Lebentritt
Assistant Examiner—Pho Luu
(74) Attorney, Agent, or Firm—Volentine Francos, PLLC

(57) ABSTRACT

A method of manufacturing an electrical interconnection of a semiconductor device produces an erosion protecting plug in a contact hole to protect a selected portion of an interlayer dielectric layer when the interlayer dielectric layer is being etched to form a recess for a conductive line. The contact hole is formed in the interlayer dielectric layer. The contact hole is filled with an organic material to form the erosion protecting plug. The organic material is a photoresist material or an organic polymer. A photoresist pattern is formed for exposing the erosion protecting plug and a portion of the interlayer dielectric layer adjacent to the erosion protecting plug. A recess which extends down to the contact hole is formed by etching the portion of the interlayer dielectric layer which is exposed by the photoresist pattern. The erosion protecting plug and the photoresist pattern are then removed. A conductive line filling the recess and a contact filling the contact hole are then formed.

16 Claims, 7 Drawing Sheets

METHOD OF MANUFACTURING AN ELECTRICAL INTERCONNECTION OF A SEMICONDUCTOR DEVICE USING AN EROSION PROTECTING PLUG IN A CONTACT HOLE OF INTERLAYER DIELECTRIC LAYER

BACKGROUND OF THE INVENTION

1. Field of the Invention

The present invention relates to a method of manufacturing a semiconductor device. More particularly, the present invention relates to a method of manufacturing an electrical interconnection on a semiconductor substrate using a damascene process.

2. Description of the Related Art

Copper (Cu), whose resistivity is about 40% lower than that of Al, is often used to form wiring including the electrical interconnections of semiconductor devices. First, the Cu is deposited on a substrate and then it is patterned to form the wiring. However, it is difficult to pattern a Cu layer by dry etching because of the low resistivity of the Cu. Accordingly, a damascene process has been developed, in which chemical mechanical polishing (CMP) is adopted, to form the wiring of a semiconductor device from a Cu layer.

The so-called single damascene process includes hole patterning steps for forming a conductive plug, and line patterning steps for forming a conductive line. Also, in the single damascene process, steps of depositing a wiring material layer, of forming a via contact hole or a recess, and of CMP are repeatedly carried out because the single damascene process is typically applied to manufacturing a semiconductor device having multiple interlayer dielectric layers. Still further, a capping layer of SiN is formed at the interfaces between the interlayer dielectric layers in order to prevent the wiring material such as Cu from diffusing to an interlayer dielectric layer.

Some steps of the process can be obviated by employing a so-called dual damascene process. However, the dual damascene process has a drawback in that a recess for the conductive line often produces a defect in a photoresist pattern required for the subsequent process of forming the via contact hole for the conductive plug.

More specifically, it is difficult to planarize the photoresist layer used for forming the contact hole, due to the depth of the recess. Accordingly, an alignment error typically occurs when exposing the photoresist. A rather thick photoresist layer may be used in an attempt to prevent such an error from occurring. In this case, however, the photoresist layer is not sufficiently exposed because of its thickness. Accordingly, an opening failure may occur in which the photoresist pattern does not expose the underlying layer at the bottom of the recess. For these reasons the dual damascene process makes it difficult to develop the photoresist layer correctly.

Also, like the single damascene process, dual damascene processes, such as a count-border dual damascene (CBDD) process or a self-align dual damascene (SADD) process, form an etch stopping layer of SiN at the interfaces between interlayer dielectric layers.

In any of the above-described damascene processes, the SiN remains over the entire interlayer dielectric layer. SiN has a relatively high dielectric constant k, namely one that is equal to or greater than 7. The effective dielectric constant of the entire interlayer dielectric layer becomes high due to the SiN. Accordingly, the semiconductor device may fail due to the high dielectric constant of the interlayer dielectric film. For example, a high dielectric constant of an interlayer dielectric film may cause a register-capacitor (RC) delay in a logic device.

SUMMARY OF THE INVENTION

It is therefore an object of the present invention to provide a method of manufacturing an electrical interconnection of a semiconductor device using a dual damascene process by which it is possible to maintain a low dielectric constant of an interlayer dielectric layer.

To achieve the above object, the present invention provides a method of manufacturing an electrical interconnection in which a contact hole is formed in the interlayer dielectric layer, and the contact hole is filled with an erosion protecting plug of an organic material most of which remains in the contact hole until a recess for accommodating a conductive line is formed in the interlayer dielectric layer. The erosion protecting plug is formed of an organic material such as a photoresist material or an organic polymer. A photoresist pattern is formed which exposes both the erosion protecting plug and the interlayer dielectric layer adjacent to the erosion protecting plug. A recess which extends down to and joins the contact hole is formed by etching the interlayer dielectric layer while the erosion protecting plug remains in the contact hole. The erosion protecting plug and the photoresist pattern are then removed. The recess and the contact hole are then filled with conductive material to form the conductive line.

According to the present invention, the electrical wiring is formed without the need for an etch stop layer or capping layer of a material layer such as SiN, which would otherwise effectively increase the dielectric constant of the interlayer dielectric layer.

BRIEF DESCRIPTION OF THE DRAWINGS

The above and other objects, features and advantages of the present invention will become more apparent by referring to the following detailed description of preferred embodiments thereof made with reference to the attached drawings, of which.

DETAILED DESCRIPTION OF THE PREFERRED EMBODIMENTS

Figure 1:
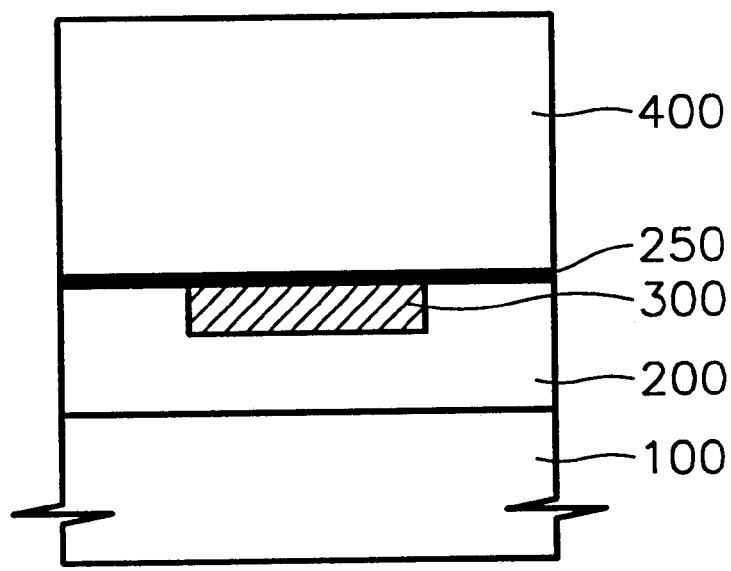
FIGS. 1 and 2 are vertical sectional views, taken in orthogonal planes, of a semiconductor substrate, and show steps of forming an interlayer dielectric layer on the semiconductor substrate in an embodiment of a method of forming an electrical interconnection according to the present invention.

The present invention will now be described more fully with reference to the accompanying drawings. In the drawings, the thickness of layers and regions are exaggerated for the sake of clarity. Also, it should be noted that when a layer is referred to as being "on" another layer or substrate, this means that the layer can be disposed directly on the other layer or substrate, or that intervening layers may be present between the layer in question and the other layer or substrate. Still further, the same reference numerals designate like elements throughout the drawings.

Figure 2:
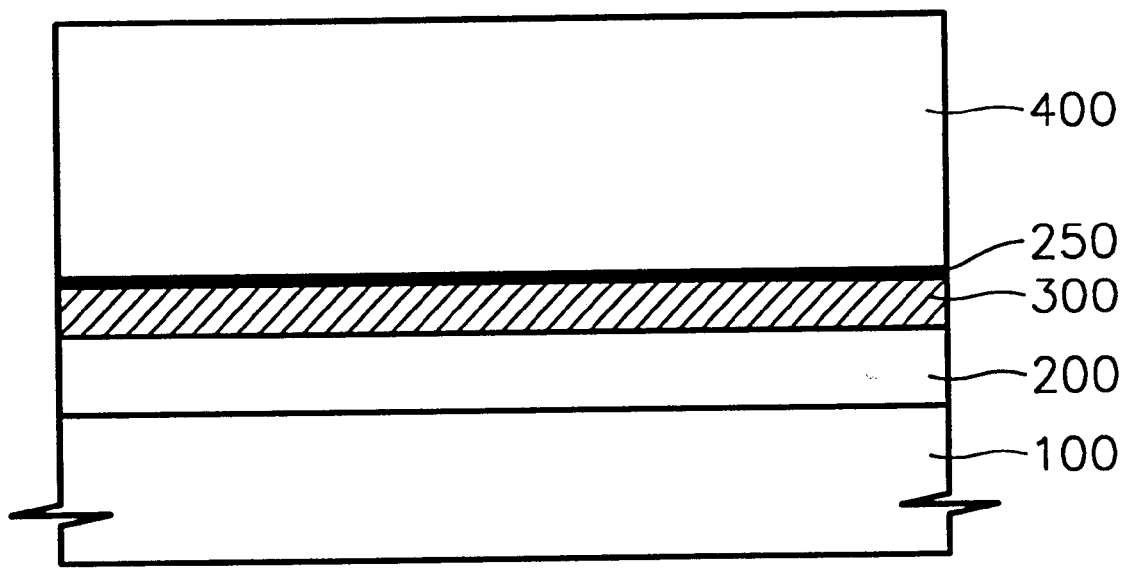

Referring first to FIGS. 1 and 2, an interlayer dielectric layer 400 is formed of an insulating material, such as $SiO_2$, on a semiconductor substrate 100 on which a substructure (not shown) is formed. A lower insulating layer 200 may be formed under the interlayer dielectric layer 400, if necessary.

Moreover, a lower longitudinally extending conductive line 300 may be formed in the lower insulating layer 200 by a damascene process, thus constituting lower wiring. Although not shown, the lower conductive line 300 may be electrically connected to the semiconductor substrate 100.

The lower conductive line 300 can be formed of a metal material such as Cu, Al, Au, or Pt. Preferably, the lower conductive line 300 is formed from a Cu layer. When the lower conductive line 300 is formed of Cu, a diffusion preventing capping layer 250 covering the lower conductive line 300 may be formed at the interface between the lower insulating layer 200 and the interlayer dielectric layer 400 in order to prevent Cu atoms from diffusing to the interlayer dielectric layer 400 which covers the lower conductive line 300. The diffusion preventing capping layer 250 may be formed of a material whose diffusivity to Cu is low, such as SiN.

Figure 3:
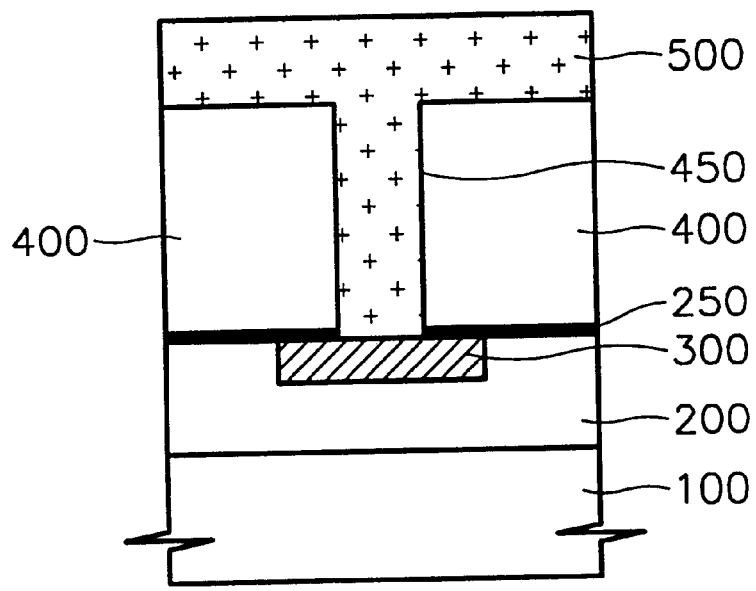
FIGS. 3 and 4 are similar sectional views of the same semiconductor substrate, showing steps of forming an erosion protecting material layer which fills a contact hole in the embodiment according to the present invention.
Figure 4:
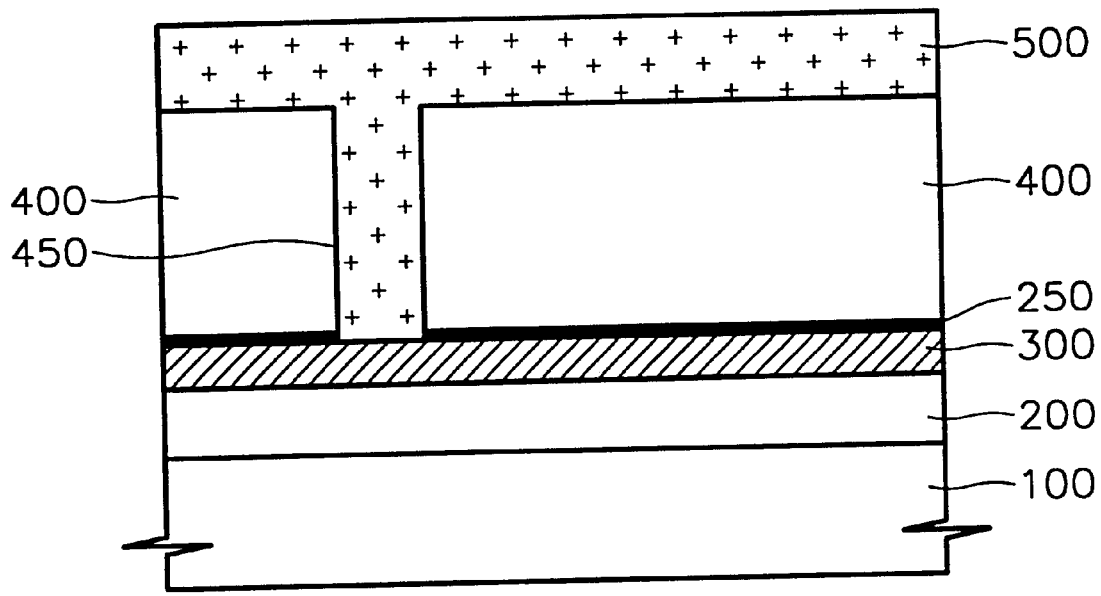

Referring to FIGS. 3 and 4, a contact hole 450 is formed by patterning the interlayer dielectric layer 400. More specifically, the contact hole 450 is a via which exposes the upper surface of the lower conductive line 300. Then, an erosion protecting material layer 500 is formed on the interlayer dielectric layer 400. The erosion protecting material layer 500 is thick enough to fill the contact hole 450.

The erosion preventing material layer 500 is formed of a material having an etching rate different from that of the interlayer dielectric layer 400. The erosion preventing material layer 500 is preferably formed of a material which has an etching rate lower than that of the interlayer dielectric layer 400 so that the erosion protecting material layer 500 can prevent the portion of the interlayer dielectric layer 400 which defines the edge of the contact hole 450 from eroding during a subsequent process of etching the interlayer dielectric layer 400.

Also, the erosion protecting material layer 500 is preferably formed of a material which can be removed together with a photoresist pattern used in a subsequent etching process. In particular, the erosion protecting material layer 500 is preferably formed of a material that can be removed by ashing and stripping processes or a wet stripping process, i.e., the particular process used for removing the photoresist pattern. Thus, it is not necessary to execute an additional and discrete process of removing the erosion protecting material layer 500.

The erosion protecting material layer 500 can be formed of an organic material. For example, the erosion protecting material layer 500 can be formed of the photoresist material or of an organic polymer. Photoresist material refers to those materials known for use in forming photoresist layers in the manufacturing of a semiconductor device.

When the erosion protecting material layer 500 is formed using photoresist material, it nonetheless must withstand a temperature of at least about 200° C. This is because the erosion protecting material layer 500 must not be evaporated or damaged. Accordingly, when the erosion protecting material layer 500 is formed of photoresist material, the material may be hardened by any appropriate measure.

For example, the photoresist layer which forms the erosion protecting material layer 500 may be thermally hardened by baking the material. It is also possible to harden the photoresist material by using a plasma process or an electron beam process of transforming the structure of the photoresist material.

In addition, the thermal treatment, the plasma process, or the electron beam process can be effectively used for hardening the erosion protecting material layer 500 when it is formed of an organic polymer.

The step of hardening the erosion protecting material layer 500 can be omitted, depending on the subsequent processes. Also, the step of hardening the erosion protecting material layer 500 can be performed after an erosion protecting plug 501 is formed.

Figure 5:
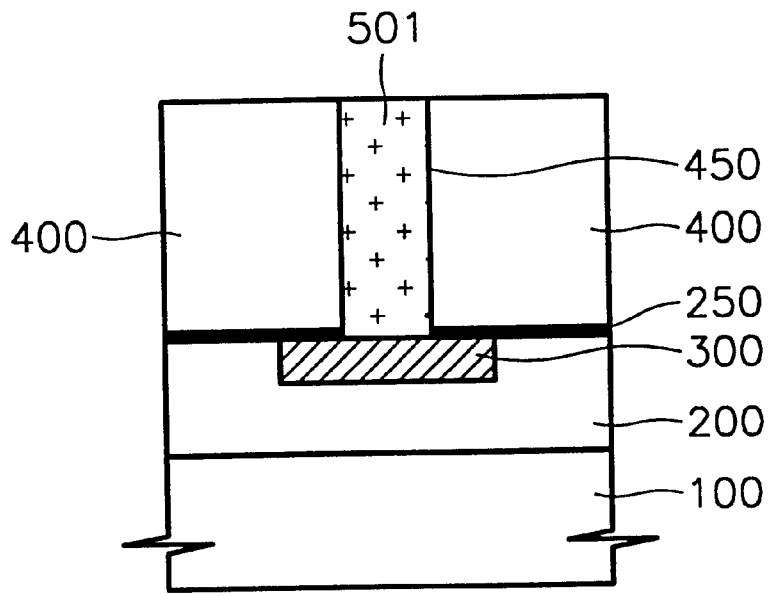
FIGS. 5 and 6 are similar sectional views of the substrate, showing steps of forming an erosion protecting plug in the embodiment according to the present invention.
Figure 6:
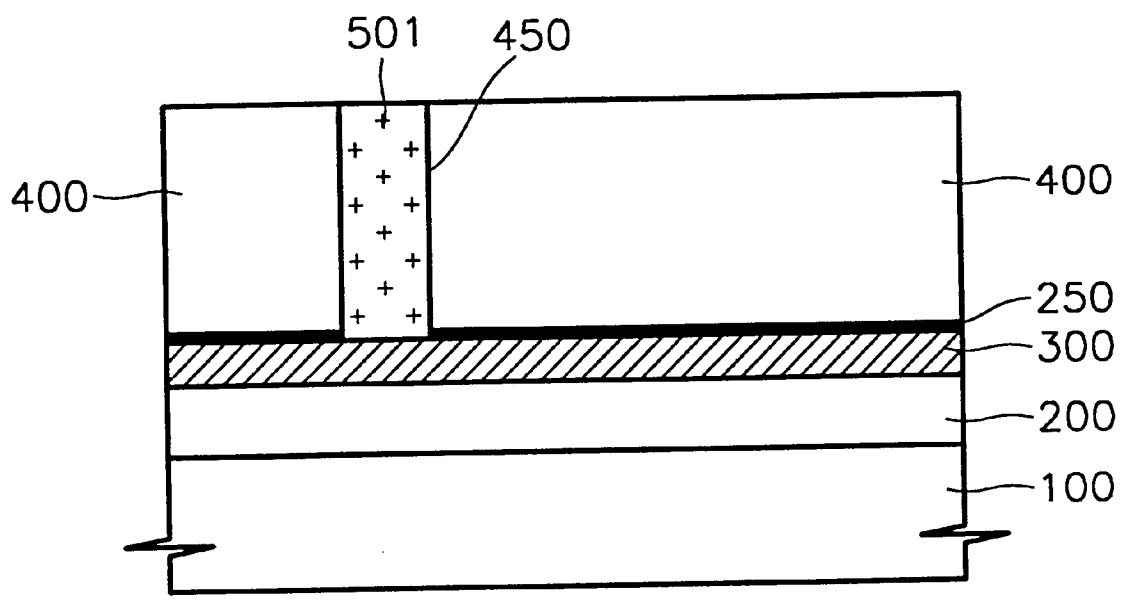

More specifically, referring to FIGS. 5 and 6, the surface of the interlayer dielectric layer 400 is exposed by etching back the erosion protecting material layer 500. Accordingly, the erosion protecting material layer 500 filling the contact hole 450 remains, thus forming an erosion protecting plug 501.

Figure 7:
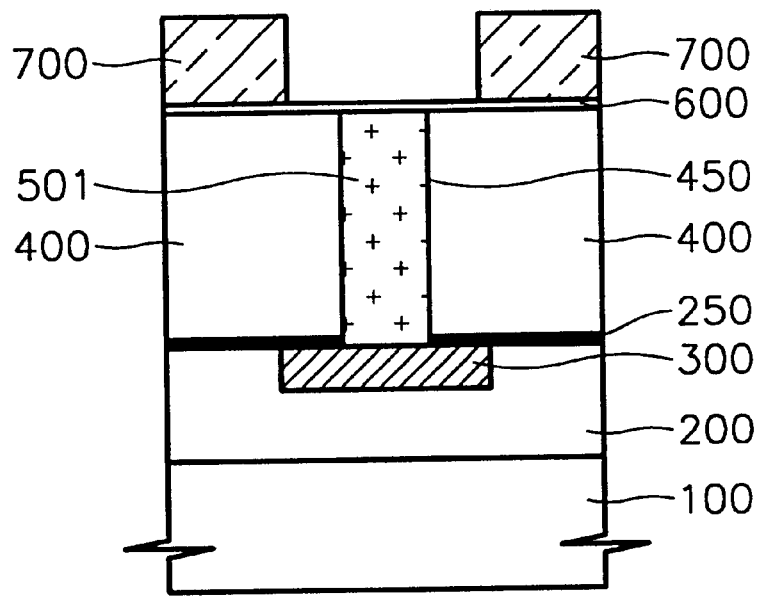
FIGS. 7 and 8 are similar sectional views of the substrate, showing steps of forming a photoresist pattern in the embodiment according to the present invention.
Figure 8:
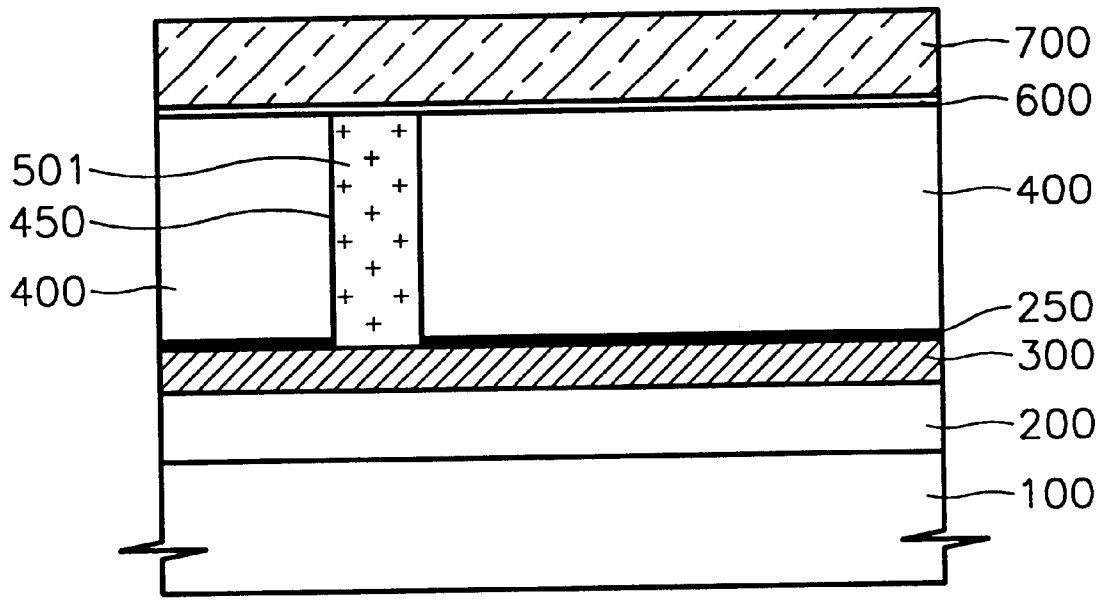

Referring next to FIGS. 7 and 8, a photoresist pattern 700 is formed on the interlayer dielectric layer 400. The photoresist pattern 700 is used as an etching mask in a subsequent process of etching the erosion protecting plug 501. The photoresist pattern 700 is formed by coating the entire surface of each of the erosion protecting plug 501 and the interlayer dielectric layer 400 with photoresist material, and subjecting the resulting layer to conventional exposure and developing steps of a photolithography process.

At this time, the photoresist pattern 700 exposes the upper portion of the erosion protecting plug 501 as well as the portion of the interlayer dielectric layer 400 adjacent to the erosion protecting plug 501. As shown in FIG. 8, the exposed portion of the interlayer dielectric layer also includes a linear portion in which a conductive line is to extend longitudinally.

The erosion protecting plug 501 can be damaged by the developing process since the erosion protecting plug 501 is formed of organic material such as photoresist material or organic polymer. In order to prevent the erosion protecting plug 501 from being damaged by the developing process, the erosion protecting material layer (500 of FIG. 3 or 4) can be hardened before the photoresist pattern 700 is formed, as described with reference to FIGS. 3 and 4.

The structure of the erosion protecting plug 501 is transformed by the thermal treatment, the plasma process, or the electron beam process used to harden the plug 501. Therefore, regardless of whether the erosion protecting plug 501 is formed of an organic polymer or of photoresist material, the erosion protecting plug 501 will not be developed by the process used to form the photoresist pattern 700.

Nonetheless, an additional protecting layer 600 may be formed instead of hardening the erosion protecting material layer 500 or in order to more adequately protect the erosion protecting plug 501 during the developing of the photoresist used to form the photoresist pattern 700. The protecting layer 600 may be formed on the erosion protecting plug 501 by spin-coating the substrate on which the erosion protecting plug 501 has been formed or by chemical vapor deposition. Preferably, the protecting layer has a thickness of no greater than 1,000 Å.

The additional protecting layer 600 can be formed of an insulating material, such as plasma enhanced silicon oxide, SiN, SiON, or SiC. The protecting layer 600 is preferably formed of silicon oxide, such as plasma enhanced silicon oxide.

A deposition process for forming the protecting layer 600 is preferably performed at a temperature equal to or less than 500° C. in order to prevent the erosion protecting plug 501 from being damaged.

In either case, i.e., the step of forming the protecting layer 600 at a temperature equal to or less than 500° C or the step of hardening the erosion protecting material layer (500 of FIG. 3 or 4), the erosion protecting plug 501 is protected from steps taken to prevent defects from existing in the photoresist pattern 700 as well as from the step of developing the photoresist pattern 700. With regard to the former, in general, when defects are generated in the photoresist pattern 700, the defective photoresist pattern 700 must be stripped and a new photoresist pattern must be formed. During this process of reworking the photoresist pattern 700, the erosion protecting plug 501 could be damaged especially by the stripping process. However, the erosion protecting plug 501 is prevented from being damaged in this case by the step of forming the protecting layer 600 or the step of hardening the erosion protecting material layer (500 of FIG. 3 or 4).

Figure 9:
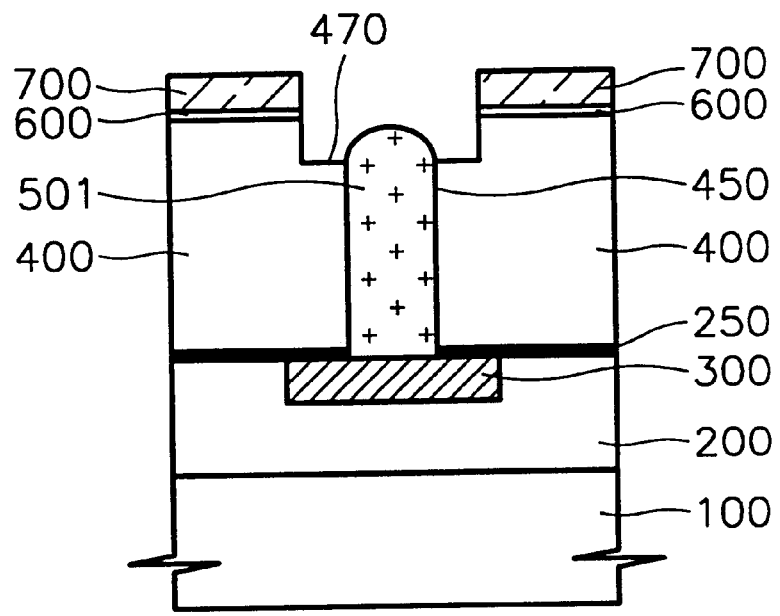
FIGS. 9 and 10 are similar sectional views of the substrate, showing steps of forming a recess in the embodiment according to the present invention.
Figure 10:
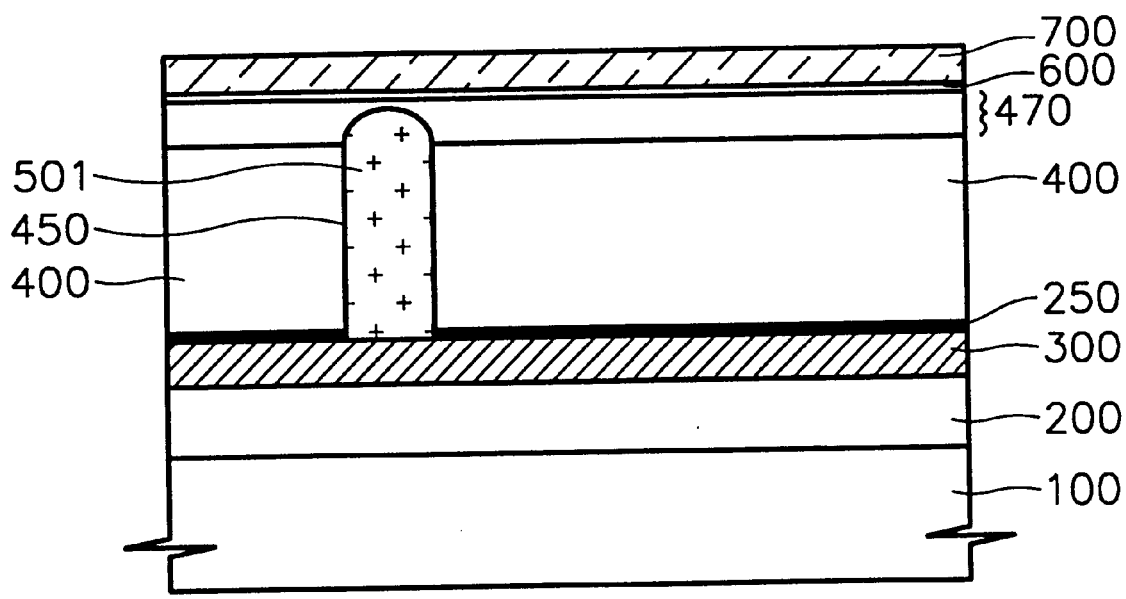

Referring now to FIGS. 9 and 10, the portion of the interlayer dielectric layer 400 exposed by the photoresist pattern 700 is etched. Specifically, the exposed portion of the interlayer dielectric layer 400 is etched by anisotropic dry etching. Accordingly, a recess 470 which joins the contact hole 450 is formed.

When the interlayer dielectric layer 400 is selectively etched by the dry etching process, the portion of the interlayer dielectric layer 400 defining the edge of the contact hole 450 would be the first to erode if it weren't for the erosion protecting plug 501. This is because the portion of the interlayer dielectric layer 400 forming the side walls of the contact hole 450 would be exposed to etchant if the erosion protecting plug 501 did not exist. If the side walls were free to receive the etchant, the etching would occur faster within the contact hole 450 than at the surface of the interlayer dielectric layer 400. Accordingly, the bottom of the recess 470 would become inclined in a downward direction. In such a case, it would be difficult to set the design rule of the semiconductor device because the conductive line filling the recess 470 would not have a uniform thickness.

However, in the present embodiment, the contact hole 450 is filled with the erosion protecting plug 501. Since the erosion protecting plug 501 has etching selectivity with respect to the interlayer dielectric layer 400, that portion of the interlayer dielectric layer 400 defining the side walls of the contact hole 450 is protected while the etching process is performed. Specifically, the erosion protecting plug 501 operates as an etching mask like the photoresist pattern 700.

Accordingly, the erosion protecting plug 501 prevents the interlayer dielectric layer 400 from eroding at the edge of the contact hole 450 toward the side walls of the contact hole 450 or prevents any erosion of the surface of the interlayer dielectric layer 400 from proliferating at the edge of the contact hole 450. Therefore, the interlayer dielectric layer 400 can be uniformly etched, the recess 470 can have a uniform depth, and the recess 470 can have a uniform line width.

Figure 11:
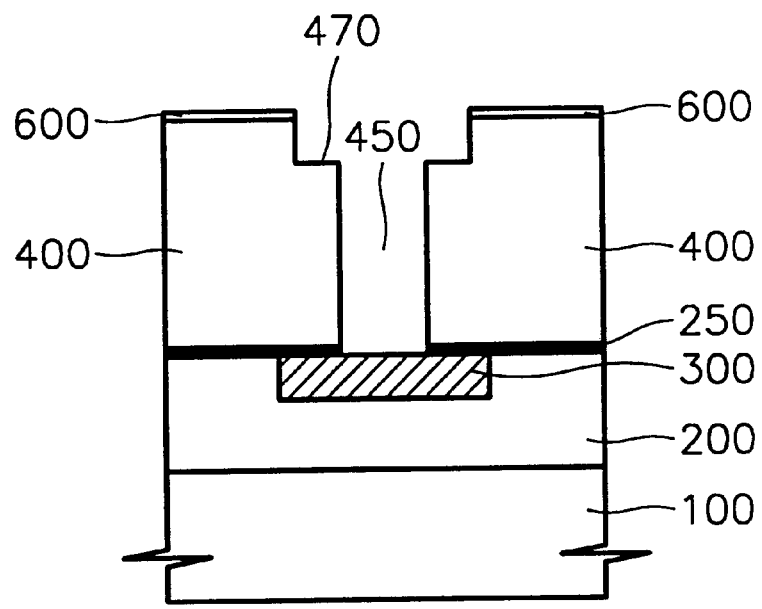
FIGS. 11 and 12 are similar sectional views of the substrate, showing steps of removing the erosion protecting plug in the embodiment according to the present invention.
Figure 12:
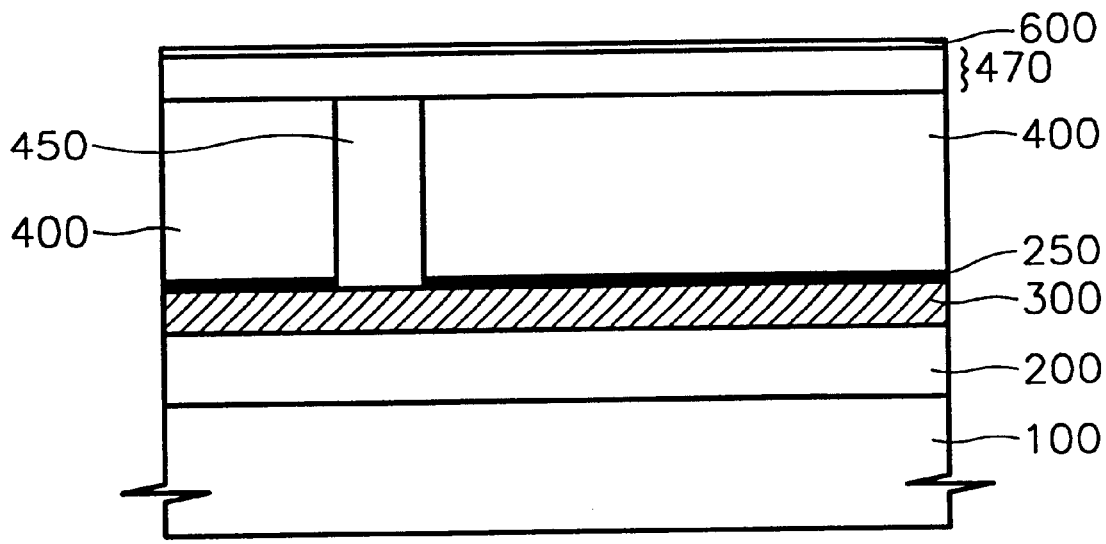

Referring to FIGS. 11 and 12, the remaining photoresist pattern 700 is removed by ashing and stripping processes or a wet stripping process. At this time, the erosion protecting plug 501 is removed because the erosion protecting plug 501 is formed of the photoresist material or of an organic polymer.

Accordingly, the contact hole 450, which exposes the lower conductive line 300, and the recess 470, which is contiguous with and extends longitudinally to both sides of the contact hole 450, are formed.

Figure 13:
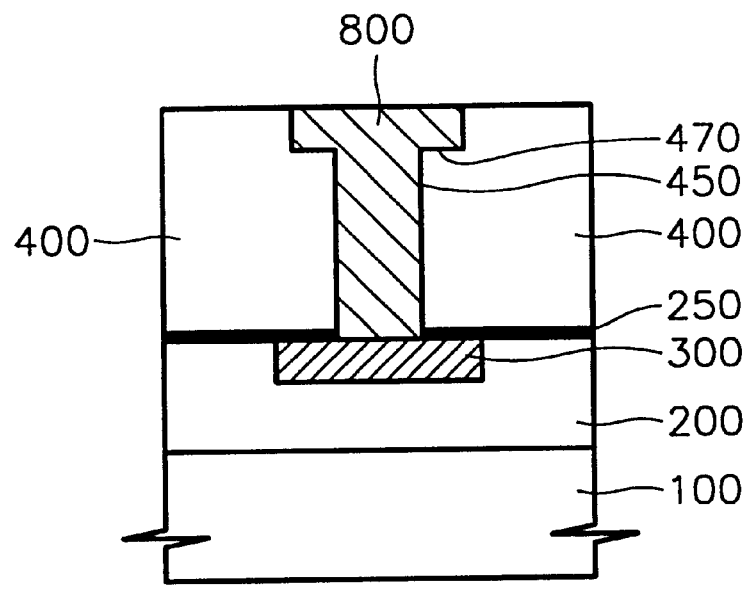
FIGS. 13 and 14 are similar sectional views of the substrate, showing steps of forming a conductive line in the embodiment according to the present invention.
Figure 14:
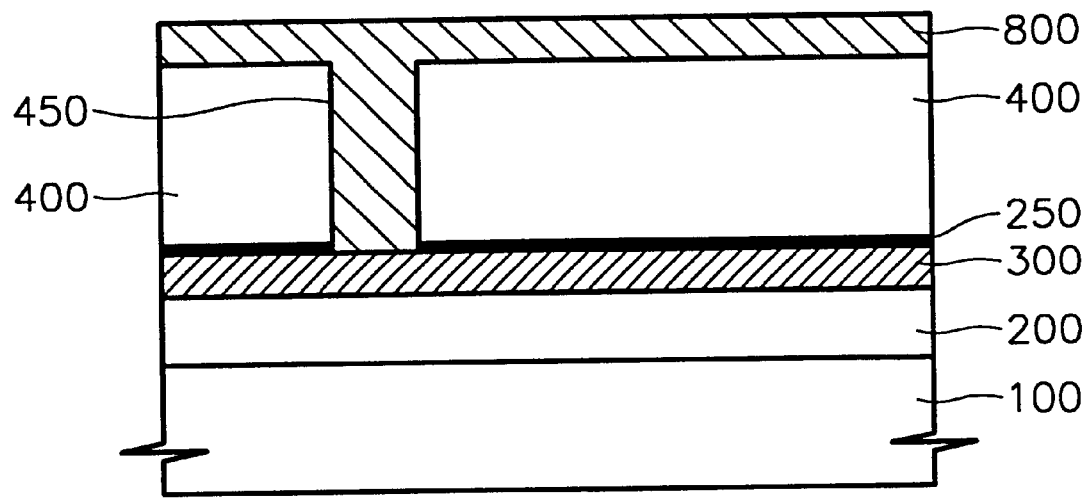

Referring to FIGS. 13 and 14, a conductive layer which fills the contact hole 450 and the recess 470 is formed on the interlayer dielectric layer 400. Then, the interlayer dielectric layer 400 is exposed by subjecting the conductive layer to chemical mechanical polishing (CMP). Consequently, a conductive line 800 electrically connected to the lower conductive line 300 is formed.

The conductive line 800 can be formed of a metal such as Cu, Al, Ag, or Pt. The conductive line 800 is preferably formed of Cu. The conductive line 800 can be formed by depositing the metal onto the interlayer dielectric layer 400 using an electro-plating method, a chemical vapor deposition method, a physical vapor deposition method, a reflow method, or a combination of these methods.

When the conductive line 800 is formed of Cu, an additional conductive diffusion barrier layer (not shown) may be formed at the interface between the conductive line 800 and the interlayer dielectric layer 400. The conductive diffusion barrier layer may be formed of a metal nitride such as Ta, W, TaN, WN, or TiN. The conductive diffusion barrier layer may be formed of a ternary compound, such as TiSiN or TaSiN, which is obtained by adding silicon atoms to metal nitride. The conductive diffusion barrier layer may also be formed of a ternary compound such as TiWN. The diffusion barrier layer can prevent the Cu atoms from being diffused to the interlayer dielectric layer 400.

As is clear from the description above, the embodiment of the present invention can form the electrical interconnection of a semiconductor device in an interlayer dielectric layer without the need for an additional SiN etch stop layer. Accordingly, the interlayer dielectric layer will not attain a dielectric constant k higher than 7 as occurs when an SiN etch stop layer is formed thereon. Because the present invention allows the effective dielectric constant k of the interlayer dielectric layer to remain low, the resulting semiconductor device is not prone to an operation failure such as a register-capacitor (RC) delay.

Also, because the present invention is applicable to the dual damascene process, the etching may be effected by employing a thin photoresist pattern, i.e., one that is significantly thinner than that used in carrying out the single damascene process. Accordingly, it is possible to prevent the opening failure associated with the photoresist pattern.

Although the present invention has been particularly shown and described with reference to preferred embodiments thereof, various changes in form and details thereto will be apparent to those of ordinary skill in the art. All such changes are seen to be within the true spirit and scope of the invention as defined by the appended claims.

What is claimed is:

1. A method of manufacturing an electrical interconnection of a semiconductor device, comprising:

forming an interlayer dielectric layer on a semiconductor substrate;

forming a contact hole in the interlayer dielectric layer;

filling the contact hole with an organic material to thereby form an erosion protecting plug of the organic material within the contact hole;

forming a photoresist pattern on the interlayer dielectric layer and which pattern exposes the erosion protecting plug and a portion of the interlayer dielectric layer extending linearly from an area directly adjacent the erosion protecting plug;

while the organic material is present within the contact hole, etching the portion of the interlayer dielectric layer exposed by the photoresist pattern to form a recess which is contiguous with the contact hole, whereby the erosion protecting plug inhibits the etching of a portion of the interlayer dielectric layer which defines the edge of the contact hole;

subsequently removing the erosion protecting plug and the photoresist pattern; and subsequently filling the recess and the contact hole with conductive material to form a conductive line.

2. The method of claim 1, wherein the filling of the contact hole comprises forming a layer of the organic material on the interlayer dielectric layer such that one part of the layer of organic material fills the contact hole and another part of the layer of organic material extends over the upper surface of the interlayer dielectric layer, and etching back the layer of organic material until the surface of the interlayer dielectric layer is exposed while the part of the layer of organic material that fills the contact hole remains.

3. The method of claim 1, wherein the filling of the contact hole comprises filling the contact hole with a photoresist material.

4. The method of claim 3, wherein the filling of the contact hole comprises forming a layer of the photoresist material on the interlayer dielectric layer such that one part of the layer of photoresist material fills the contact hole and another part of the layer of photoresist material extends over the upper surface of the interlayer dielectric layer, hardening the layer of photoresist material, and etching back the layer of photoresist material until the surface of the interlayer dielectric layer is exposed while the part of the layer of photoresist material that fills the contact hole remains.

5. The method of claim 4, wherein the hardening of the layer of photoresist material comprises baking the photoresist material.

6. The method of claim 4, wherein the hardening of the layer of photoresist material comprises exposing the photoresist material to plasma.

7. The method of claim 4, wherein the hardening of the layer of photoresist material comprises irradiating the photoresist material with an electron beam.

8. The method of claim 1, and further comprising forming a protecting layer on the erosion protecting plug of a material which protects the erosion protecting plug during the forming of the photoresist pattern.

9. The method of claim 8, wherein the protecting layer is formed to a thickness of no greater than 1,000 Å.

10. The method of claim 8, wherein the forming of the protecting layer comprises forming a layer selected from the group consisting of a plasma enhanced silicon oxide layer, a SiN layer, a SiON layer, and a SiC layer, on the erosion protecting plug.

11. The method of claim 8, wherein the protecting layer is formed by chemical vapor deposition.

12. The method of claim 8, wherein the protecting layer is formed by spin-coating.

13. The method of claim 1, wherein the removing of the erosion protecting plug and the photoresist pattern comprises ashing and stripping which remove the erosion protecting plug together with the photoresist pattern.

14. The method of claim 1, wherein the removing of the erosion protecting plug and the photoresist pattern comprises wet stripping which removes the erosion protecting plug together with the photoresist pattern.

15. The method of claim 1, wherein the filling of the contact hole comprises filling the contact hole with an organic polymer.

16. The method of claim 1, wherein the forming of the conductive line comprises filling the recess with Cu.

* * * * *